(12) United States Patent
McKeown et al.

(10) Patent No.: US 7,808,789 B2
(45) Date of Patent: Oct. 5, 2010

(54) STRUCTURE AND METHOD TO FORM A HEAT SINK

(75) Inventors: Stephen Arthur McKeown, Endicott, NY (US); Gary Geno Stefani, Conklin, NY (US); David Reed Benedict, Susquehanna, PA (US); Andrew Karl Crane, Owego, NY (US)

(73) Assignee: BAE Systems Controls Inc., Johnson City, NY (US)

( * ) Notice: Subject to any disclaimer, the term of this patent is extended or adjusted under 35 U.S.C. 154(b) by 190 days.

(21) Appl. No.: 11/982,630

(22) Filed: Nov. 2, 2007

(65) Prior Publication Data

US 2009/0116198 A1    May 7, 2009

(51) Int. Cl.
*H05K 7/20* (2006.01)
*F28F 7/00* (2006.01)
*H01L 23/26* (2006.01)
*H01L 23/34* (2006.01)
*B21D 53/02* (2006.01)

(52) U.S. Cl. .................. 361/710; 361/704; 361/679.54; 361/709; 361/719; 165/80.2; 165/185; 174/16.3; 257/713; 257/719; 29/890.03

(58) Field of Classification Search ............ 361/679.54, 361/704, 709, 710, 719; 165/80.2, 80.3, 165/185; 174/16.3; 257/713, 719, 722, E23.103; 29/890.03
See application file for complete search history.

(56) References Cited

U.S. PATENT DOCUMENTS

| 6,127,724 | A | 10/2000 | DiStefano |
| 7,063,127 | B2 | 6/2006 | Gelorme et al. |
| 7,254,034 | B2 | 8/2007 | Bolle et al. |
| 7,365,984 | B2* | 4/2008 | Jeong .......................... 361/709 |
| 2002/0154483 | A1* | 10/2002 | Homer et al. ............... 361/704 |
| 2007/0210438 | A1 | 9/2007 | Briere et al. |

OTHER PUBLICATIONS

IBM Technical Database account No. NN9403225.*

* cited by examiner

*Primary Examiner*—Zachary M Pape
(74) *Attorney, Agent, or Firm*—Scully, Scott, Murphy & Presser, P.C.; Paul J. Esatto, Jr.

(57) ABSTRACT

The present invention relates generally to heat removal from circuit board components and, more specifically, to improved thermal management for circuit board components mounted on electrical wiring boards. The structure comprises a heat sink; and an auxiliary heat sink positioned in thermal contact with the heat sink and a circuit board component on a wiring board, the auxiliary heat sink having a plurality of slots located in a central portion of the auxiliary heat sink, wherein the auxiliary heat sink is both mechanically compliant and thermally conductive with both the heat sink and the circuit board component.

16 Claims, 3 Drawing Sheets

STRUCTURE AND METHOD TO FORM A HEAT SINK

FIELD OF THE INVENTION

The present invention relates generally to heat removal from circuit board components and, more specifically, to improved thermal management for circuit board components mounted on electrical wiring boards.

BACKGROUND OF THE INVENTION

A typical wiring board includes a section of circuit board material (e.g., fiberglass, copper, vias, etc.) and circuit board components mounted to the electrical wiring board. Examples of circuit board components include integrated circuits (ICs), resistors, and inductors. Typically, circuit board components generate heat during operation. However, cooling by simple, un-enhanced natural convection, radiation and/or by heat conduction, is insufficient to keep junction temperatures below maximum operating limits.

Therefore, some ICs include heat sinks (e.g., a heat-spreader plate or cooling fins) to facilitate cooling. Heat sinks are thermally attached to the chips using a compliant (i.e., deformable) thermally conductive material. Conventional heat sinks maintain thermal contact with the corresponding circuit board component by being attached to the wiring board located adjacent to the IC component. Heat is removed from the cooling plate of the heat sink by methods such as forced air cooling and/or circulating liquid coolants. As the IC generates heat, heat flows from the IC package to the heat sink, and dissipates into the surrounding air. The fluid stream generated then carries the heat away, thus cooling the IC.

Another method for reducing excessive temperatures includes providing a low thermal resistance path between the circuit board components on the electrical wiring board and a primary heat sink structure. However, accumulation of tolerances in typical electronic assemblies can result in large differences in height between the top of the component and the heat sink. As such, it is often difficult to achieve a proper, reliable contact between surfaces to maintain mechanical compliance and a thermally conductive connection. Additionally, the two surfaces to be thermally connected may not be sufficiently parallel and in fact may shift relative to one another as the structure is transported, or thermally or mechanically stressed. These large stresses generated on the IC package increase the risk of IC failure. Therefore, height variations and misalignments may be compensated for by use of thermal gap fillers or thick layers of thermal grease, both of which have low thermal conductivity (e.g., 1-8 Watts per meter-Kelvin (W/m-K)). However, thick thermal gap fillers and thermal grease layers add considerable thermal resistance at the junctions, resulting in an increase in component temperatures. Furthermore, in practice, as the components shift, thermal grease may be squeezed out of the gaps between components resulting in wide fluctuations in thermal resistance.

Therefore, it would be desirable to have a low thermal resistance heat dissipation technique to accommodate for the variations and dynamics of individual components mounted on electrical wiring boards.

SUMMARY OF THE INVENTION

The present invention relates generally to heat removal from circuit board components and, more specifically, to improved thermal management for circuit board components mounted on electrical wiring boards.

Specifically, and in broad terms, the auxiliary heat sink structure of the present invention comprises:

a heat sink; and an auxiliary heat sink positioned in thermal contact with the heat sink and a circuit board component on a wiring board, the auxiliary heat sink having a plurality of slots located in a central portion of the auxiliary heat sink.

In a related aspect, the auxiliary heat sink is mechanically compliant and thermally conductive with both the heat sink and the circuit board component.

In a related aspect, the structure further comprises a thermal interface material (TIM) between, and in contact with, the auxiliary heat sink, the heat sink, and the circuit board component, wherein the TIM includes at least one of a thermal grease and a thermal gap filler pad.

In a related aspect, the circuit board component is positioned between the wiring board and the auxiliary heat sink.

In a related aspect, the structure further comprises a plurality of fasteners to connect the auxiliary heat sink to the heat sink and the wiring board.

In a related aspect, the plurality of slots comprises a series of stacked openings in the central portion of the auxiliary heat sink, wherein each opening is parallel to a top planar surface of the auxiliary heat sink.

In a related aspect, the auxiliary heat sink comprises a copper material.

Another aspect of the invention relates to a method for removing heat from a heat sink structure comprising:

forming an auxiliary heat sink having a plurality of slots located in a central portion of the auxiliary heat sink;

providing a heat sink in thermal contact with a circuit board component on a wiring board and the auxiliary heat sink; and connecting the auxiliary heat sink to the heat sink and the wiring board.

In a related aspect, forming the plurality of slots includes machining a solid block of thermally conductive material.

In a related aspect, forming the plurality of slots includes patterning a series of layers of conductive material.

In another aspect according to the present invention, a heat sink structure formed on a wiring board is provided comprising a heat generating component attached to the wiring board, a heat sink, and an auxiliary heat sink positioned adjacent to, and in thermal contact with the heat sink and the heat generating component, the auxiliary heat sink having a plurality of slots located in a central portion thereof.

The present invention relates generally to heat removal from circuit board components and, more specifically, to improved thermal management for circuit board components mounted on electrical wiring boards. A plurality of slots located in a central portion of the thermally conductive auxiliary heat sink helps to absorb local tolerance differences on the circuit board component.

It should be emphasized that the drawings of the instant application are not to scale but are merely schematic representations, and thus are not intended to portray the specific dimensions of the invention, which may be determined by skilled artisans through examination of the disclosure herein.

DETAILED DESCRIPTION OF THE INVENTION

Embodiments of the present invention provide structures and methods for thermally coupling a heat sink and an auxiliary heat sink to a circuit board component. The auxiliary heat sink is attached to the heat sink and located between the heat sink and an associated circuit board component. As the auxiliary heat sink attaches to a wiring board carrying the circuit board component, the auxiliary heat sink thermally contacts the circuit board component. A plurality of slots located in a central portion of the auxiliary heat sink helps to absorb local tolerance differences on the circuit board component to provide a more uniform contact across the surface of the circuit board component under varying mechanical stress and thermal conditions. The plurality of slots also limits the amount of stress generated by the auxiliary heat sink on the circuit board component when the auxiliary heat sink attaches to the circuit board component and to the heat sink.

Figure 1:
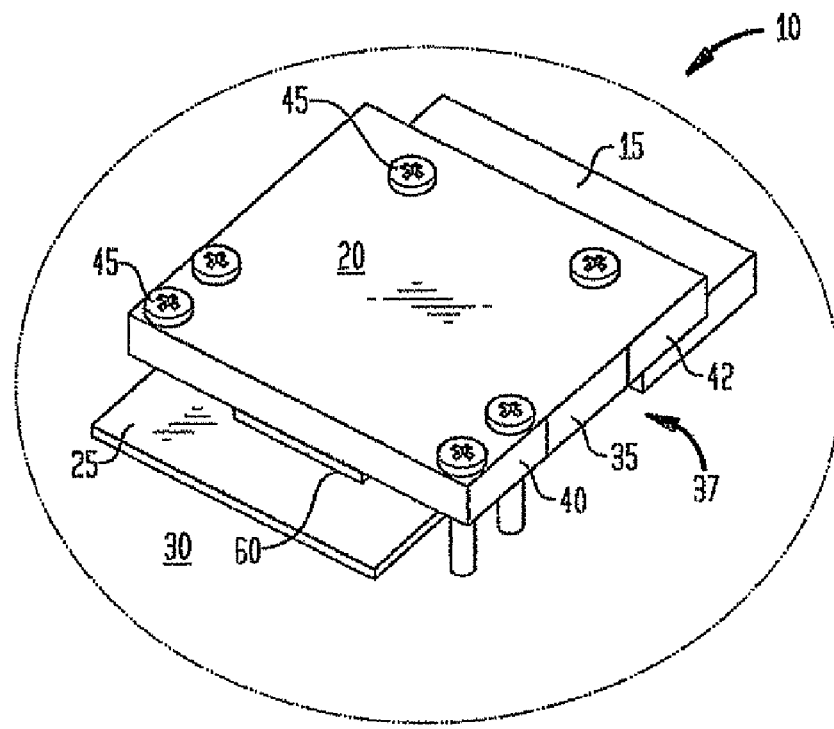
FIG. 1 is a pictorial representation illustrating the basic heat sink structure and related method according to embodiments of the invention.
Figure 2:
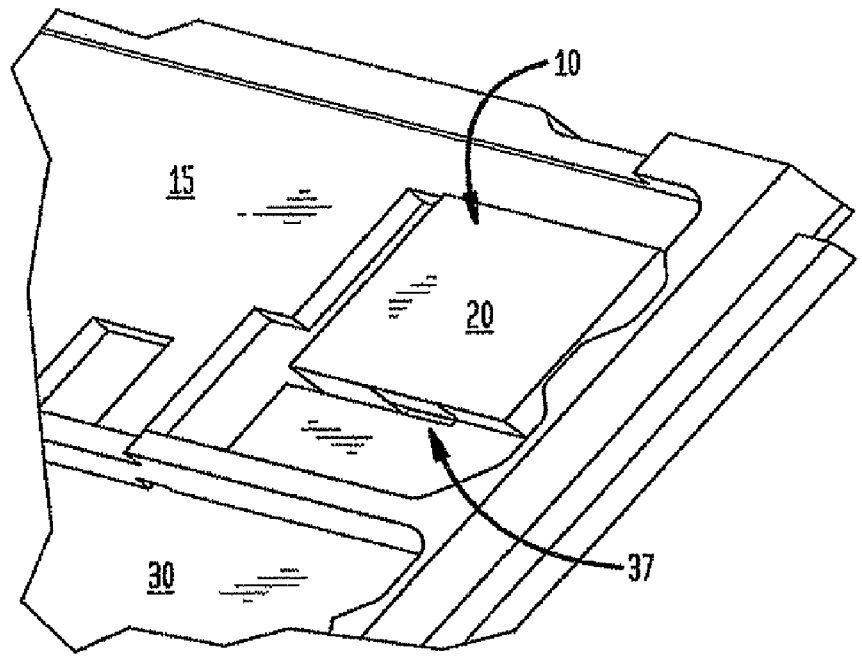
FIG. 2 is a pictorial representation illustrating the basic heat sink structure and related method according to embodiments of the invention.

Turning to the figures, FIGS. 1-2 illustrate a heat sink structure 10 according to one embodiment of the invention. The heat sink structure 10 formed on a wiring board 30 includes a heat generating component (i.e., circuit board component 25) attached to the wiring board 30. The heat sink structure further includes a heat sink 15 and an auxiliary heat sink 20 positioned adjacent to, and in thermal contact with the heat sink 15 and the heat generating component 25, the auxiliary heat sink 20 having a plurality of slots 35 located in a central portion 37 thereof. The auxiliary heat sink 20 mounts to the circuit board component 25, such as an IC, and to the heat sink 15. In this configuration, the auxiliary heat sink 20 is mechanically compliant and thermally conductive with the circuit board component 25 and with the heat sink 15.

The heat sink 15 is configured to thermally contact a surface of auxiliary heat sink 20 to direct heat generated by the circuit board component 25 to the heat sink 15. It can be appreciated that the heat sink 15 may be a heat-spreader plate, as shown, and/or include a plurality of cooling fins. Both the heat-spreader plate and cooling fins dissipate heat away from the circuit board component 25 by way of convection. For example, an air stream (not shown) travels across the heat sink 15 and auxiliary heat sink 20. The air stream carries the heat received by the heat sink 15 from the circuit board component 25 away from the circuit board component 25.

In one embodiment, the auxiliary heat sink 20 is configured as a piece of thermally conductive material with a relatively flexible central portion 37 that attaches to the heat sink 15 and is oriented between the heat sink 15 and the circuit board component 25. As also shown in FIG. 1, the circuit board component 25 is positioned between the wiring board 30 and the auxiliary heat sink 20. Based upon this configuration and the geometry of auxiliary heat sink 20, auxiliary heat sink 20 thermally couples the heat sink 15 to the circuit board component 25. For example, the auxiliary heat sink transfers heat generated by the circuit board component 25 to the heat sink 15, thereby reducing the operating temperature of the circuit board component 25. The auxiliary heat sink 20, and in particular the central portion 37 with the plurality of slots 35, also absorbs a stress generated by dimensional variations with the heat sink 15, and minimizes its effect on the circuit board component 25. By absorbing stresses generated by the heat sink 15, the auxiliary heat sink 20 minimizes damage caused by relatively large stresses placed on the circuit board component 25 due to large structural and/or thermal differences between the heat sink 15 and the circuit board component 25.

In one arrangement, the auxiliary heat sink 20 is formed from a relatively high-strength material, such as a beryllium copper alloy. Using a highly conductive material, such as copper, provides adequate thermal conduction properties to conduct heat from the circuit board component 25 to the heat sink 15. The copper auxiliary heat sink 20 acts as a heat spreader to distribute heat from the circuit board component 25 along the base of the heat sink 15, thereby allowing relatively fast thermal transfer between the circuit board component 25 and the heat sink 15.

Figure 3:
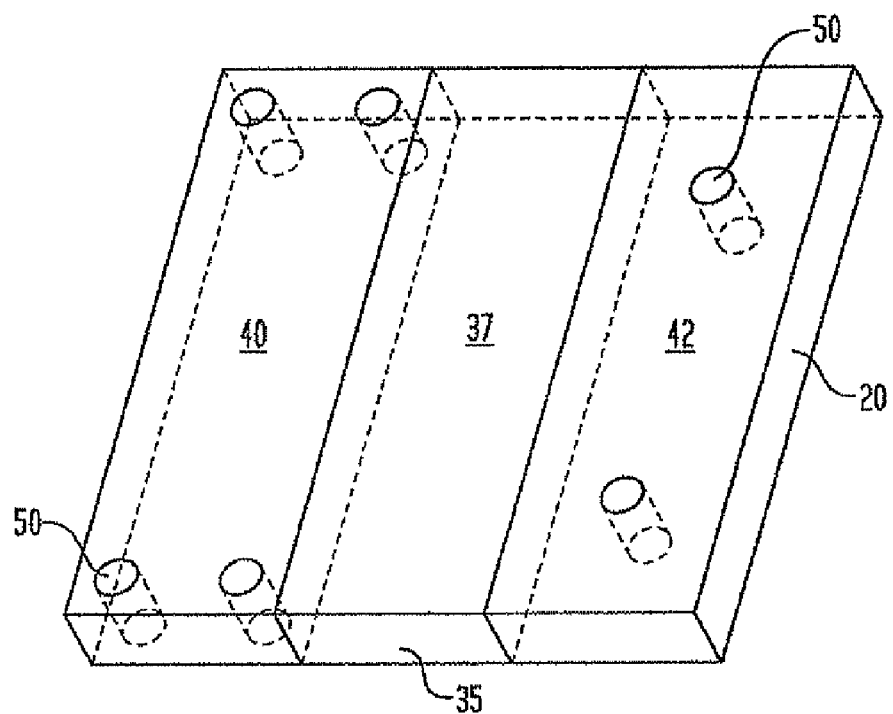
FIG. 3 is a pictorial representation illustrating the basic heat sink structure and related method according to embodiments of the invention.

In one embodiment, as more clearly shown in FIG. 3, auxiliary heat sink 20 has two solid end sections 40 and 42, respectively flanking slotted central portion 37 which has a plurality of slots 35 formed thereon. The slotted central portion 37 has a width approximately equal to the width of end sections 40, 42. However, it can be appreciated to one skilled in the art that the slotted central portion 37 can vary in height/width and number of slots depending on the desired application. Auxiliary heat sink 20 connects to the heat sink 15 and the wiring board 30 using a plurality of fasteners 45 (FIG. 1), such as screws or bolts, positioned in openings 50 through the auxiliary heat sink 20. By securely connecting the auxiliary heat sink 20 to the heat sink 15 and the wiring board 30, the thermal conductivity between the auxiliary heat sink and the heat sink 15 is maintained, and thereby provides thermal transfer between the heat sink 15 and the circuit board component 25 during electrical operation of wiring board 30.

Figure 4:
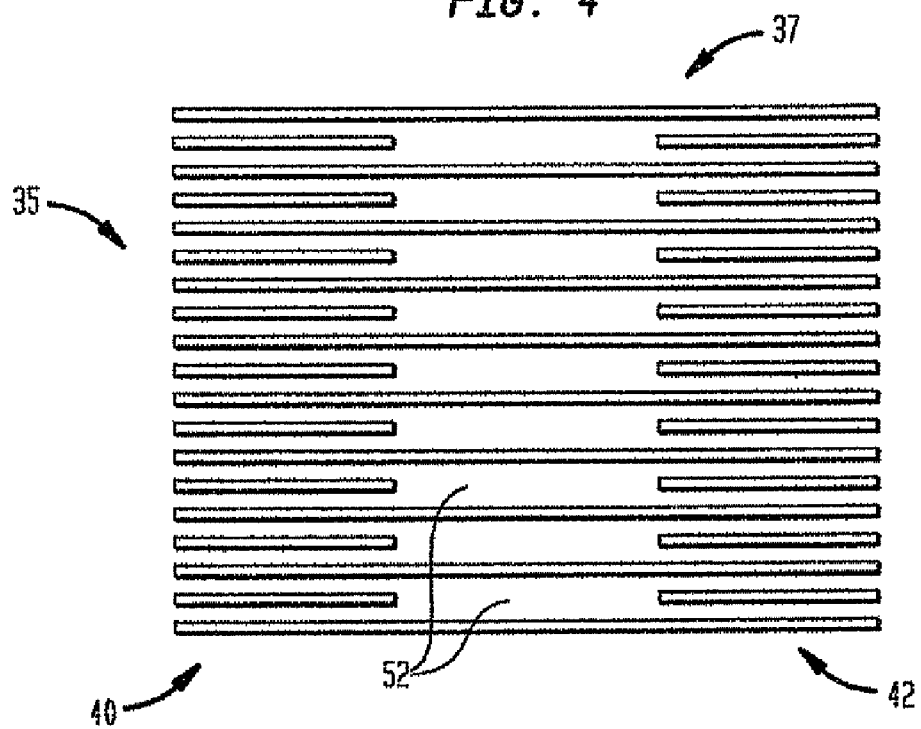
FIG. 4 is a pictorial representation (through a cross sectional view) illustrating the plurality of slots in the auxiliary heat sink structure and related method according to embodiments of the invention.

FIG. 4 shows an exploded side view of the plurality of slots 35 located in the central portion 37 of the auxiliary heat sink 20. The plurality of slots 35 comprises a series of openings 52 extending through the auxiliary heat sink 20. Forming the plurality of slots 35 includes patterning a series of layers of conductive material. Thin pieces of conductive material (e.g., copper) are laminated by soldering, brazing, or other methods to form the auxiliary heat sink 20 having two solid end portions 40, 42 and the center portion 37. Increasing the number of layers increases the thermal conduction without significantly increasing the overall stiffness of the auxiliary heat sink 20.

Figure 5A:
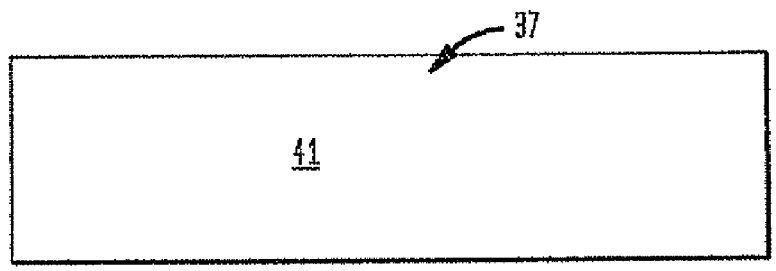
FIGS. 5a and 5b are pictorial representations illustrating one method for forming the auxiliary heat sink structure according to an embodiment of the invention.
Figure 5B:
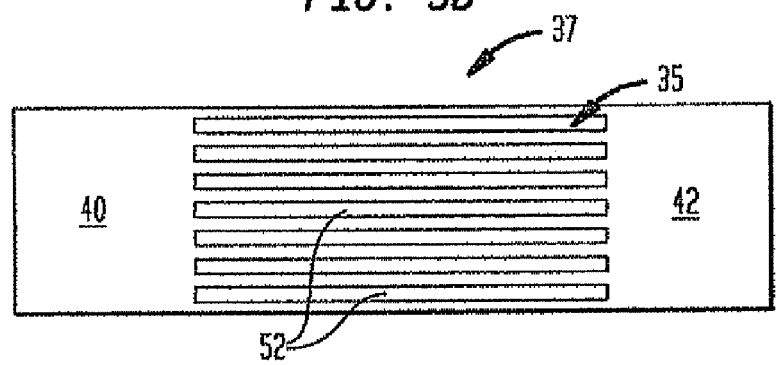
Figure 6:
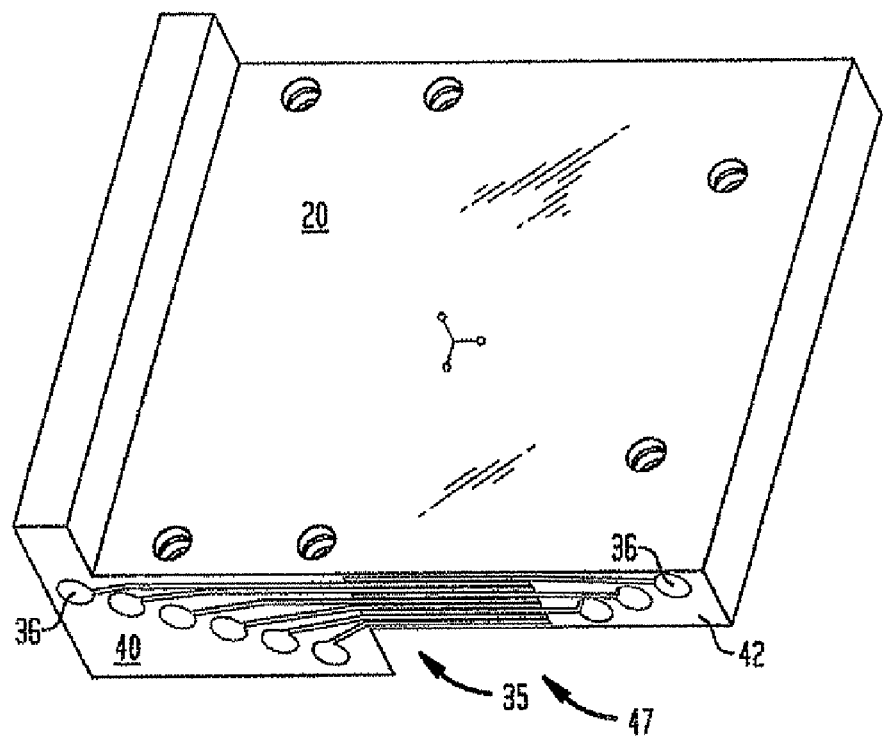
FIG. 6 is a pictorial representation illustrating another method for forming the auxiliary heat sink structure according to an embodiment of the invention.

In another embodiment, as shown in FIGS. 5a-5b, forming the plurality of slots 35 includes machining a solid block of conductive material 41 to form the series of openings 52 in the center portion 37. FIG. 5a illustrates the solid block of conductive material 41 (e.g., copper) prior to the machining step shown in FIG. 5b. A number of machining methods are possible for forming the slotted central portion 37 without departing from the scope of the invention. For example, FIG. 6 shows one embodiment wherein the plurality of slots 35 are formed using an electrical discharge machine (EDM). As is known in the art, EDMs remove metal by producing a rapid series of repetitive electrical discharges. These electrical discharges are passed between an electrode and the solid block of conductive material 41 being machined. The small amount of material that is removed from the solid block of conductive material 41 is flushed away with a continuously flowing fluid. The repetitive discharges create a set of successively deeper recesses in the solid block of conductive material 41 until the final shape is produced. As shown in FIG. 6, the plurality of slots 35 formed with the EDM extends beyond the central portion 37 and into the solid end portions 40 and 42 to a plurality of EDM holes 36. The plurality of EDM holes 36 is provided for compatibility between the solid block of conductive material 41 and the EDM. Although the plurality of slots 35 extends beyond the central portion 37, there is a higher density of slots within the central portion 37.

As discussed above, in the case where there is a large mechanical and/or thermal tolerance difference between the heat sink 15 and the circuit board component 25, a stress is generated on the auxiliary heat sink 20. Application of stresses or pressures on the auxiliary heat sink 20 necessitates that it be formed from a material having a relatively small compliance (e.g., relatively stiff, high-strength material) and a relatively large thermal conductance, such as a copper material. However, the mechanical compliance of the material used to form the auxiliary heat sink 20 is sufficient to allow the auxiliary heat sink 20 to maintain good surface contact with each of the heat sink 15 and the circuit board component 25 under high stress conditions. Use of such a high-strength and thermally conductive material minimizes the thermal resistance between an interface of the auxiliary heat sink 20 and both the heat sink 15 and the circuit board component 25, thereby reducing the risk that the circuit board component 25 will fail due to overheating during electrical operation of wiring board 30.

The plurality of slots 35 in the central portion 37 of the auxiliary heat sink 20 absorbs a portion of the stress generated by the heat sink 15 on the circuit board component 25. For example, in the case where such circuit board components attach to a wiring board by an array of solder balls, the stress can cause the solder balls of the array to fracture, thereby causing the circuit board component to become inoperable. However, the slotted portion of the auxiliary heat sink 20 slightly deflects when the heat sink 15 attaches to the wiring board 30 and limits the stress applied on the circuit board component 25. Reducing the mechanical stress minimizes potential damage to the circuit board component 25.

FIGS. 1-2 illustrate one method for attaching the heat sink structure 10 to the wiring board 30. The method comprises forming the auxiliary heat sink 20 having the plurality of slots 35 located in the central portion 37 of the auxiliary heat sink 20; positioning the heat sink 15 in thermal contact with the auxiliary heat sink 20 and the circuit board component 25 on the wiring board 30; and connecting the auxiliary heat sink 20 to the heat sink 15 and the wiring board 30. According to one method for forming the heat sink structure 10, when a manufacturer assembles the heat sink structure 10, the manufacturer attaches the heat sink 15 to the wiring board 30 using coupling mechanisms such as stand-offs (not shown) and fasteners 45, wherein the fasteners 45 are configured to engage associated openings 50 defined by the auxiliary heat sink 20, such as shown in FIG. 3. As the manufacturer connects the fasteners 45 with the wiring board 30, the bottom surface of the auxiliary heat sink 20 contacts a top surface (i.e., an opposite surface to the surface facing the wiring board 30) of circuit board component 25. In some cases, a small gap may remain between the auxiliary heat sink 20 and both the heat sink 15 and the circuit board component 25. As is known in the art, a thermal interface material (TIM) can be formed between, and in contact with, the auxiliary heat sink 20, the heat sink 15, and the circuit board component 25 to compensate for height variations and misalignments. The thermal interface material distributes the stress generated by the auxiliary heat sink 20 over the surface of the circuit board component 25 and increases the contact area (e.g., minimizes the presence of non-contacting portions or air gaps) between the auxiliary heat sink 20 and both the heat sink 15 and the circuit board component 25. The thermal interface material therefore increases the thermal transfer between the circuit board component 25 and the auxiliary heat sink 20 and the heat sink 15.

According to an embodiment of the invention, the thermal interface material includes thermal gap fillers (TGF), phase-change thermal pads and/or layers of thermal grease, all of which have relatively high thermal conductivity. Thermal greases, which may also be referred to generally as a thermal compound, are well known in the art and can be silicone-based, ceramic-based, or metal-based. Phase-change thermal pads, which soften and begin to flow at a specific temperature, minimize thermal contact resistance by compensating for irregularities between components. Thermal gap fillers typically include thermally conductive ceramic filler particles dispersed in a conformable configuration and form a stable polymer binder to produce a TGF pad 60, as shown in FIG. 1. TGF pad 60 is used to establish a bridge across air channels to conduct heat from the circuit board component to the auxiliary heat sink 20. TGF pad 60 is adhered to the circuit board component 25 using methods known in the art. For example, the TGF pad 60 can be coupled to the circuit board component 25 using a heat conductive adhesive as is well known in the art. It should be appreciated to one skilled in the art that the TGF-pad 60 may be constructed in a variety of shapes and sizes.

As shown in FIGS. 1 and 3, heat sink structure 10 has a plurality of openings 50 and fasteners 45. The openings 50 can generally be formed at any location within solid portions 40, 42 of auxiliary heat sink 20. Securing the fasteners 45 to the wiring board 30 causes the auxiliary heat sink 20 to compress. The plurality of slots 35 limits the stress applied on the circuit board component 25, however, and provides thermal contact between the heat sink 15 and the circuit board component 25 regardless of local or global tolerance differences.

Those skilled in the art will understand that there can be many variations made to the embodiments explained above while still achieving the same objective of those embodiments and the invention in general.

For example, as shown in FIGS. 1-6, the auxiliary heat sink 20 has a substantially rectangular profile. Such a configuration is by way of example only. The geometry of the auxiliary heat sink is based upon the location or number of circuit board components 25 on a wiring board 30 for a particular circuit board structure.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A heat sink structure comprising:
   a heat sink; and
   an auxiliary heat sink, positioned in thermal contact with the heat sink and a circuit board component on a wiring board, to transfer heat generated by the circuit board component to the heat sink, the auxiliary heat sink comprising a solid planar surface defined by two solid sections respectively flanking a central portion of the auxiliary heat sink, the central portion of the auxiliary heat sink further comprising a series of stacked openings wherein at least one of the openings is substantially parallel to the planar surface of the auxiliary heat sink, and a plurality of fasteners extending through each of the solid sections to attach the heat sink and the auxiliary heat sink to the wiring board.

2. The structure of claim 1, wherein the auxiliary heat sink is mechanically compliant and thermally conductive with both the heat sink and the circuit board component.

3. The structure of claim 1, further comprising a thermal interface material (TIM) between, and in contact with, the auxiliary heat sink, the heat sink, and the circuit board component.

4. The structure of claim 3, wherein the TIM includes at least one of a thermal grease, a phase-change thermal pad and a thermal gap filler pad.

5. The structure of claim 1, wherein the circuit board component is positioned between the wiring board and the auxiliary heat sink.

6. The structure of claim 1, wherein the auxiliary heat sink comprises a copper material.

7. The heat sink structure of claim 1, wherein the solid planar surface covers and at least partially encloses the auxiliary heat sink.

8. A heat sink structure formed on a wiring board, the heat sink structure comprising:
   a heat generating component attached to the wiring board;
   a heat sink; and
   an auxiliary heat sink, positioned adjacent to, and in thermal contact with the heat sink and the heat generating component, to transfer heat generated by the heat generating component to the heat sink, the auxiliary heat sink comprising a solid planar surface defined by two solid sections respectively flanking a central portion of the auxiliary heat sink, the central portion of the auxiliary heat sink further comprising a series of stacked openings wherein at least one of the openings is substantially parallel to the planar surface of the auxiliary heat sink, and a plurality of fasteners extending through each of the solid sections to attach the heat sink and the auxiliary heat sink to the wiring board.

9. The structure of claim 8, wherein the auxiliary heat sink is mechanically compliant and thermally conductive with both the heat sink and the heat generating component.

10. The structure of claim 8, further comprising a thermal interface material (TIM) between, and in contact with, the auxiliary heat sink, the heat sink, and the heat generating component.

11. The structure of claim 10, wherein the TIM includes at least one of a thermal grease, a phase-change thermal pad and a thermal gap filler pad.

12. The structure of claim 8, wherein the auxiliary heat sink comprises a copper material.

13. A method of removing heat from a heat sink structure, the method comprising:
   forming an auxiliary heat sink comprising a solid planar surface defined by two solid sections respectively flanking a central portion of the auxiliary heat sink, the central portion of the auxiliary heat sink further comprising a series of stacked openings wherein at least one of the openings is substantially parallel to the planar surface of the auxiliary heat sink;
   positioning the auxiliary heat sink in thermal contact with a circuit board component on a wiring board and a heat sink to transfer heat generated by the circuit board component to the heat sink; and
   connecting the auxiliary heat sink to the heat sink and the wiring board using a plurality of fasteners extending through each of the solid sections.

14. The method of claim 13, wherein the position of the auxiliary heat sink permits the auxiliary heat sink to be mechanically compliant and thermally conductive with both the heat sink and the circuit board component.

15. The method of claim 13, wherein forming the series of stacked openings includes patterning a series of layers of thermally conductive material.

16. The method of claim 13, wherein forming the series of stacked openings includes machining a solid block of thermally conductive material.

\* \* \* \* \*